United States Patent
Torikoshi et al.

[11] Patent Number: 6,045,856
[45] Date of Patent: Apr. 4, 2000

[54] PROCESS FOR PRODUCING A RESISTIVE ELEMENT BY DIFFUSING GLASS

[75] Inventors: Kaoru Torikoshi; Katsuhiro Sato; Hiroyuki Tanaka; Fumiaki Tambo; Yutaka Akasaki, all of Minami Ashigara, Japan

[73] Assignee: Fuji Xerox Co., Ltd., Tokyo, Japan

[21] Appl. No.: 08/235,235

[22] Filed: Apr. 29, 1994

Related U.S. Application Data

[63] Continuation of application No. 08/153,198, Nov. 17, 1993, abandoned, which is a continuation of application No. 07/844,856, Mar. 3, 1992, abandoned.

[30] Foreign Application Priority Data

Mar. 7, 1991 [JP] Japan ................................ 3-041684

[51] Int. Cl.$^7$ ................................................ B05D 5/12
[52] U.S. Cl. ................ 427/96; 427/126.5; 427/374.2; 427/419.4
[58] Field of Search ................ 427/96, 126.5, 427/376.2, 419.4

[56] References Cited

U.S. PATENT DOCUMENTS

| 5,059,941 | 10/1991 | Gofuku et al. | 427/126.5 |
| 5,100,702 | 3/1992 | Maeda et al. | 427/126.5 |

FOREIGN PATENT DOCUMENTS

| 53-100496 | 9/1978 | Japan . |
| 54-119695 | 9/1979 | Japan . |
| 55-63804 | 5/1980 | Japan . |

OTHER PUBLICATIONS

Roydn P. Jones, Hybrid Circuit Design and Manufacture Marcel Nekker 1982 p. 9–49.

*Primary Examiner*—Benjamin L. Utech
*Attorney, Agent, or Firm*—Oliff & Berridge, PLC

[57] ABSTRACT

A resistive element is produced by forming a substrate glazed with glass, printing or coating a resistive element-forming paste onto the substrate, calcining the paste in a first heating step to form an element comprising a film on the substrate and subjecting the resulting element to a heat treatment in a second heating step to diffuse an amount of glass into the film to increase resistivity of the element.

12 Claims, 2 Drawing Sheets

PROCESS FOR PRODUCING A RESISTIVE ELEMENT BY DIFFUSING GLASS

This is a Continuation of application Ser. No. 08/153,198 filed Nov. 17, 1993, now abandoned which in turn is a Continuation of application Ser. No. 07/844,856, filed Mar. 3, 1992, now abandoned.

FIELD OF THE INVENTION

This invention relates to a resistive element for use in various electronic components, such as hybrid IC and thermal heads and to a process for producing the same.

BACKGROUND OF THE INVENTION

Current techniques for fabrication of a resistive element to be used in electronic devices, e.g., hybrid IC and thermal heads, include thick film formation and thin film formation. The former process comprises coating a resistive element-forming paste, for example, a dispersion of ruthenium oxide powder and glass frit in organic vehicles consisting of a solvent and a resin, on a substrate by screen printing followed by calcination to form a resistive element as disclosed, e.g., in JP-A-53-100496 and JP-A-54-119695 (the term "JP-A" as used herein means an "unexamined published Japanese patent application"). The latter process is application of vacuum technology and comprises depositing a thin film of a sparingly soluble metal, e.g., tantalum, on a substrate by sputtering and making a pattern by photolithographic technique to form a thin resistive film as disclosed, e.g., in JP-A-55-63804. The resistive element produced by the thin film formation technique is now of use in some thermal heads.

Resistive elements to be used in electronic devices such as a hybrid IC and a thermal head have been increasingly demanded to serve for multi- and high-functions by themselves. In the case of a thermal head, for instance, there have been demands for high resolving power, improved tone reproduction, color reproduction, reduction in power consumption, and reduction in size. To meet these demands, resistive elements with a variety of characteristics, particularly with the resistivity ranging from low to high, have been demanded.

While in the above-mentioned thick film formation resistivity is controlled by a mixing ratio of ruthenium oxide conductive component and a glass component, the resulting resistive element fundamentally consists of a composite system of two oxide components each having a particle size distribution. It has been therefore difficult to sufficiently control the resistivity simply by adjustment of the mixing ratio.

In the thin film formation, vacuum evaporation or sputtering is conducted by using an evaporation source (target) of prescribed composition prepared according to a desired resistivity or by using a plurality of evaporation sources to form a deposit having a desired resistivity. For production of a resistive element whose resistivity widely ranges, a number of targets are required and, also, the vacuum evaporation or sputtering must be under very strict control so as to maintain the composition of the deposit always constant.

SUMMARY OF THE INVENTION

An object of the present invention is to provide a resistive element which may have a desired resistivity depending on the particular use.

Another object of the present invention is to provide a process for producing relatively easily a resistive element which may have a desired resistivity depending on the particular use.

A further object of the present invention is to provide an electronic component, e.g., a thermal head, using such a resistive element.

It has now been found that the above objects of the present invention are accomplished by a process for producing a resistive element comprising printing or coating a resistive element-forming paste on a substrate via a glass thin film, calcining the paste, and subjecting the resulting resistive element to a heat treatment; a resistive element obtained by this process; and an electronic component using the resistive element.

DETAILED DESCRIPTION OF THE INVENTION

Figure 1:
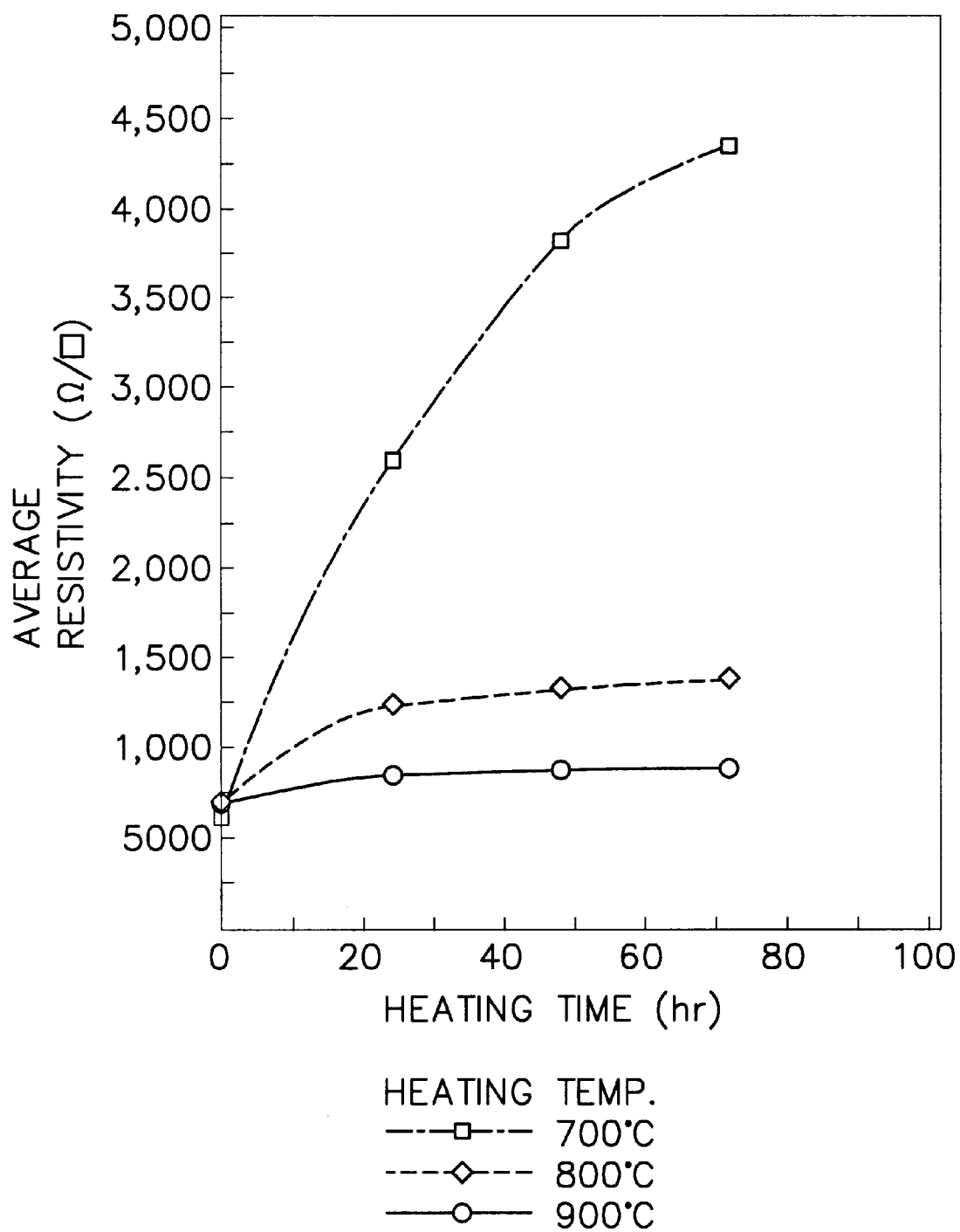
FIG. 1 illustrates the plots of surface resistivity vs. heating conditions.

The resistive element-forming paste which can be used in the present invention preferably includes a homogeneous paste containing an organometallic compound of a platinum group metal, e.g., Ir, Rh, Ru, Pt, Pd, and Os. If desired, the paste may contain one or more metallic or non-metallic organic compounds of Si, Bi, Pb, Sn, Al, B, Ti, Zr, Ca, Ba, etc.

The mixing ratio of the organometallic compound to the metallic or non-metallic organic compound is not particularly limited, and the optimum mixing ratio depends on desired properties (e.g., resistivity) of the resulting resistive element and is determined without difficulty.

Examples of the organometallic compound of a platinum group metal which can be used include carboxylates, diketone-type chelate compounds, alkoxide or mercaptides of the platinum group metals. Preferred are those represented by formulae (I) to (VI)

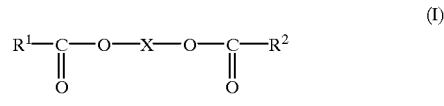

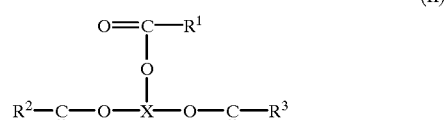

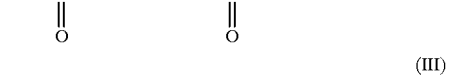

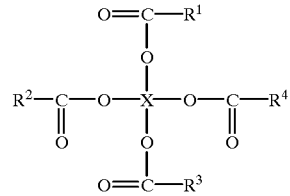

-continued

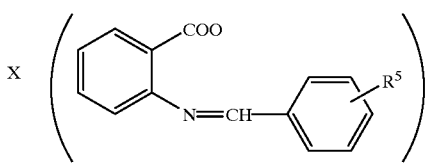
(IV)

$$X(OOCR^6)_3 \quad (V)$$

$$X(R^8COCR^7COR^9)_3 \quad (VI)$$

wherein X represents Ir, Rh, Pt, Pd or Os, particularly preferably Ir, Rh or Ru; $R^1$ to $R^4$ each represents a hydrogen atom or an alkyl group preferably having 1 to 5 carbon atoms; $R^5$ represents a hydrogen atom, an alkyl group preferably having 1 to 5 carbon atoms, or an alkoxy group preferably having 1 to 5 carbon atoms; $R^6$ represents an alkyl group preferably having 2 to 13 carbon atoms; $R^7$ represents a hydrogen atom or an alkyl group preferably having 1 to 5 carbon atoms; and $R^8$ and $R^9$ each represents an alkyl group preferably having 1 to 5 carbon atoms.

Examples of the metallic or non-metallic organic compound which may be used in combination with the above organometallic compound include carboxylates, diketone-type chelate compounds, alkoxides, and mercaptides. Of these, the compounds represented by formulae (VII) to (IX) are preferably used:

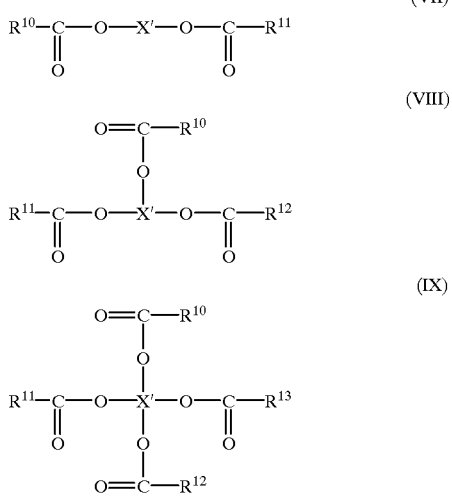

wherein $R^{10}$ to $R^{13}$ each represents a hydrogen atom or an alkyl group preferably having 1 to 5 carbon atoms; and X' represents an element selected from Si, Bi, Pb, Sn, Al, B, Ti, Zr, Ca and Ba, provided that X' is the element having the coordination number in conformity with the respective formula (VII), (VIII) or (IX).

The resistive film-forming paste of the present invention is prepared by dissolving or dispersing the organometallic compound with or without the above-described metallic or non-metallic organic compound in a solvent preferably capable of dissolving the organometallic compound. As a solvent there may be used a high boiling solvent, preferably having a boiling point of 100° C. or higher and more preferably from 150 to 300° C., such as terpineol, benzyl acetate, isophorone, butyl carbitol acetate, benzyl alcohol.

The solvent may be used singly or as admixture. The resistive film-forming paste generally contains 50 to 70 wt % of the solvent, the balance being solids.

Viscosity of the resistive film-forming paste is preferably adjusted within the range of 3,000 to 30,000 cp. For the purpose, a viscosity adjustor may be added, such as asphalt, cellulose compounds (e.g., ethyl cellulose, nitrocellulose, and carboxymethylcellulose), general-purpose polymers (e.g., polyethylene, polystyrene, polypropylene, polymethyl methacrylate, polyethyl methacrylate, polycarbonate), and natural high molecular compounds (e.g., resins). Of these, asphalt is preferably used singly or in combination with others.

The paste may further contain any other additives for improving printability or stabilizing characteristics as a resistive element.

The process consisting of printing or coating the paste on a substrate followed by calcination is called a metallo-organic deposition (MOD) process which has been developed for producing a thin resistive film while exploiting the advantage of the above-mentioned thick film formation technique in that the production equipment is inexpensive. It should be noted, however, that the process of the present invention is applicable to not only the MOD process but the general thick film formation using a paste of ruthenium oxide.

Production of resistive elements is explained in detail below.

The resistive element-forming paste is coated or printed on a substrate via a glass thin film. The glass thin film can be provided by a conventional thick-film forming process, for example, by screen-printing a paste having a glass fine powder dispersed in a solvent and calcining the coated paste. The glass thin film generally has a thickness of 5 to 200 μm and preferably 10 to 100 μm.

The thus coated or printed resistive element-forming paste is calcined at a temperature at which organic substances in the coated paste are decomposed and eliminated, and it is generally from 400 to 900° C. and preferably from 600 to 800° C. The calcination time is from one minute to 10 hours and preferably from 30 minutes to two hours. The resulting resistive element is then subjected to a heat treatment for one minute to 100 hours at a temperature higher than the calcination temperature, generally from 600 to 1000° C. The heat treatment may follow the calcining step without intermission or after cooling the calcined element. The calcination temperature should not be high enough to cause an interaction between the coated paste and the glass thin film in order to obtain a resistive element having a desired shape. During the subsequent heating treatment at a higher temperature, the so-shaped resistive element undergoes the interaction between a silicon atom etc. in the glass thin film and metallic or non-metallic elements in the resistive element, whereby resistivity of the resulting resistive film can be controlled.

The thus formed resistive film generally has a thickness of 0.1 to 1 μm, preferably 0.2 to 0.5 μm, which is about 1/10 the coated thickness of the resistive film-forming paste.

The process of the present invention is characterized in that the resistive film formed on a substrate with a glass thin film therebetween is subjected to a heat treatment to cause glass components in the glass thin film to be diffused into the resistive film thereby increasing the resistivity. Thus, resistivity control can be effected by heating the resistive element obtained by using a resistive element-forming paste under controlled heating conditions.

That is, the resistivity can be very finely controlled by appropriate selection of heating conditions, actually by adjustment of heating temperature and time. In general, the severer the heating conditions, the more the diffusion of the glass components from the glass thin film and, as a result, the higher the resistivity. The lower limit of the heating temperature is the heat decomposition temperature of the resistive element-forming paste. As a matter of course, the heating temperature must be below the melting point of the substrate. The heating temperature need not be higher than the melting point of the glass thin film because diffusion of the glass components take place at temperatures below the melting point of the glass. More specifically, the heating temperature preferably ranges from 600° C. up to 900° C. in which the resistive film hardly undergoes changes of composition. A more preferred heating temperature is from 700° to 850° C. The resistivity control by the heat treatment has no influence on other electrical characteristics, e.g., variation in resistivity, voltage resistance, and power resistance.

Starting from the resistivity level before heat treatment, the resistivity can be increased to an arbitrary level as desired according as the amount of the glass components diffused is increased by the heat treatment. The starting resistivity before heat treatment is decided by the composition of the resistive element-forming paste and is usually up to about 700 $\Omega$/square. A controllable range of resistivity, though depending on the heating conditions, usually ranges from the resistivity before heat treatment to about 4 k$\Omega$/square.

Figure 2:
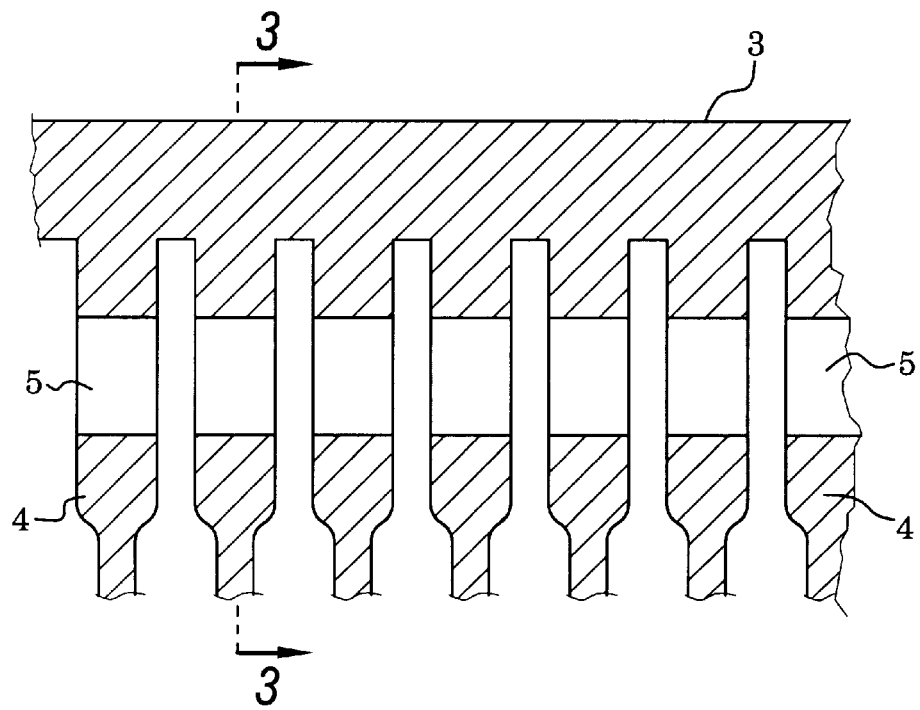
FIG. 2 is a plane view of the thermal head according to the present invention.
Figure 3:
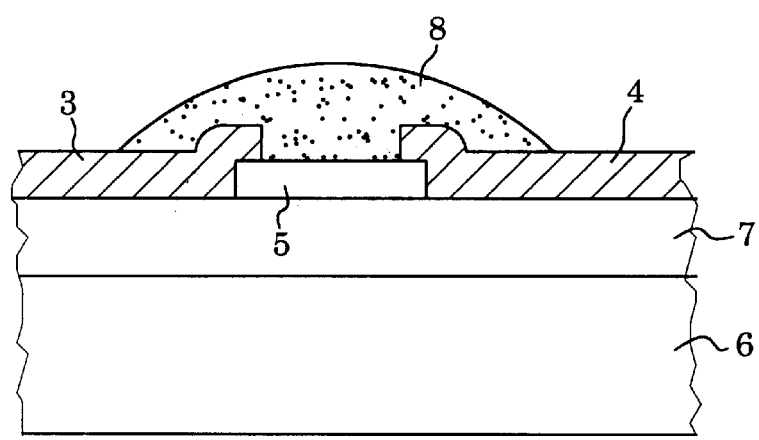
FIG. 3 is a cross section of the thermal head shown in FIG. 2 along X-Y line.

The process of the present invention is effectively applied to production of various electronic components such as thermal heads. FIGS. 2 and 3 show a plane view and a cross section, respectively, of thermal head utilizing the resistive film of the present invention, wherein 3 is a common electrode, 4 a counter electrode, 5 a resistive film, 6 an alumina support, 7 an under-glaze layer (glass thin film), and 8 an over-glaze layer. The thermal head can be produced by the following manner. First, a resistive film is formed as a heating element on a glazed alumina support (having under-glaze layer 7 formed on alumina support 6), and a photoresist is then provided thereon, followed by imagewise exposure and development, whereby a resist pattern is formed on the resistive film. Then, uncovered portions of the resistive film are etched away to form 8 to 24 dot/mm-resistant pattern 5, on which a metalloorganic gold past D27 produced by NORITAKE CO., LTD. is uniformly coated and calcined to form a gold film. Thereafter, a photoresist is coated on the gold film, imagewise exposed to light and developed to form a resist pattern for a common electrode and a counter electrode, and uncovered portions of the gold film are etched with an iodine-potassium iodide ($I_2 \cdot KI$) solution to form a conductive pattern. subsequently, a glass paste 490BH produced by Electro-Science Laboratory Co. is printed on each element as a protective layer and calcined to form over-glaze layer 8. The resistive film of the thus produced thermal head exhibits relatively uniform resistivity and small variation in resistivity on voltage application.

The present invention is now illustrated in greater detail with reference to Examples. In Examples, measurements of surface resistivity were made with a surface resistivity meter "MCP-T400" (manufactured by Mitsubishi Petrochemical Co., Ltd.).

EXAMPLE 1

Iridium resinate "A-1123", silicon resinate "#28FC", and bismuth resinate "#8365" (all produced by N.E. CHEMCAT CO.) were mixed at an Ir:Si:Bi atomic ratio of 1:1:1. The viscosity of the mixture was adjusted to 5,000 to 30,000 cps with a resin, e.g., ethyl cellulose, etc. and/or a solvent, e.g., $\alpha$-terpineol, butylcarbitol acetate, etc. The thus prepared resistive element-forming paste was screen-printed on a 8 mm×glazed ceramic substrate "NK 217" (produced by Noritake Co., Ltd.) using a stainless steel screen of 150 to 400 mesh.

The printed substrate was dried at 120° C. and then calcined in an infrared belt calcination furnace at a peak temperature between 500° C. and 800° C. for 10 minutes to form a resistive film (8 mm×230 mm) having a thickness of from 0.1 to 0.4 $\mu$m. The resulting resistive heating element had a surface resistivity of about 700 $\Omega$/square (thickness: 0.4 $\mu$m).

The resistive element was then heat treated in a calcination furnace at 700° C., 800° C., or 900° C. for a prescribed time, and the surface resistivity was measured. The results obtained were plotted in FIG. 1 with the resistivity as ordinate and the heating time abscissa. It can be seen that the resistivity gradually increases with an increase of heating time. It is also seen that the resistivity can be controlled by a combination of a selected heating temperature and a selected heating time.

In this example, the heat treatment caused no change in characteristics of the resistive film, such as variation in resistivity in the film.

EXAMPLE 2

A resistive element was produced in the same manner as in Example 1, except for using a ruthenium oxide-based paste for thick film formation "GZX-0.5K" (produced by Tanaka Matsusei). The resistive film had a thickness of about 10 $\mu$m and a resistivity of up to 500 $\Omega$/square.

The resistive element was heat treated at a temperature between 700° C. and 900° C. in a calcination furnace. It was proved as a result that the resistivity was controllable within a range of from 500 $\Omega$/square to 4 k$\Omega$/square.

While the present invention has been described in the foregoing Examples with respect to the particular use of screen printing, the present invention is not limited thereto. For example, the resistive element may be formed by coating a paste by any other coating methods employed for thick film formation, such as dip coating, roll coating, spin coating and the like on the entire surface of a substrate, followed by etching to obtain a resistive film of any desired shape. In addition, an ink jet method may be employed to directly obtain a desired resistive film pattern.

As is apparent from the foregoing Examples, the present invention makes it possible to arbitrarily control resistivity by subjecting a resistive film to a heat treatment while utilizing the currently employed techniques for production of resistive elements. There are provided resistive elements of widely varied resistivity from the same resistive film, which are thus applicable to a broadened range of electronic devices demanding various resistivity requirements.

While the invention has been described in detail and with reference to specific examples thereof, it will be apparent to one skilled in the art that various changes and modifications can be made therein without departing from the spirit and scope thereof.

What is claimed is:

1. A process for producing a resistive element, comprising:

(A) forming a substrate glazed with glass;
   (B) printing or coating a resistive element-forming paste onto said substrate glazed with glass;
   (C) calcining the paste in a first heating step by maintaining said paste at a first temperature level to decompose and eliminate organic substances in the coated paste without interaction between the coated paste and the glass to form an element comprising a film on said substrate glazed with glass; and (D) subjecting the resulting element to a heat treatment in a second heating step at a second temperature higher than said first temperature level to diffuse an amount of the glass into said film to increase resistivity of said element.

2. A process as claimed in claim 1, wherein said heat treatment of step (D) is at a temperature higher than the heat decomposition temperature of the paste and lower than the melting point of the substrate.

3. A process as claimed in claim 2, wherein said heat treatment is at a temperature of from 600° to 900° C.

4. A process as claimed in claim 3, wherein said heat treatment of step (D) is at a temperature of from 700° to 850° C.

5. A process as claimed in claim 1, wherein said paste contains an organometallic compound of a platinum group metal.

6. A process as claimed in claim 1, wherein said paste comprises an organometallic compound.

7. A process as claimed in claim 1, wherein said first heating step is conducted at a temperature level below the temperature of glass diffusion and said second heating step is conducted at a temperature at or above the temperature of glass diffusion.

8. A process as claimed in claim 1, further comprising cooling said resulting element subsequent to said first heating step and prior to said second heating step.

9. A process as claimed in claim 1, wherein said heat treatment of step (D) comprises maintaining the temperature in the range of 600–1000° C. for a period of heating of one minute to 100 hours.

10. A process as claimed in claim 1, wherein conditions of said heat treatment are selected to control resistivity of said element.

11. A process for producing a resistive element, comprising:

(A) forming a substrate glazed with glass;

(B) printing or coating a resistive element-forming paste onto said substrate glazed with glass;

(C) calcining the paste in a first heating step by maintaining said paste at a first temperature from 400 to 900° C.;

(D) cooling said paste from said first temperature to form an element comprising film on said substrate glazed with glass; and (E) subjecting the resulting element to a heat treatment in a second heating step at a second temperature higher than said first temperature and from 600 to 1000° C. to diffuse an amount of said glass into said film.

12. A process as claimed in claim 11, wherein conditions of said heat treatment are selected to control resistivity of said element.

* * * * *